(12) United States Patent
Mellitz (10) Patent No.: US 7,076,401 B2
(45) Date of Patent: Jul. 11, 2006

(54) METHOD AND APPARATUS FOR MEASURING DATA TIMING USING UNITY TIME-VOLTAGE SAWTOOTH RAMPS

(75) Inventor: Richard I. Mellitz, Irmo, SC (US)

(73) Assignee: Intel Corporation, Santa Clara, CA (US)

( * ) Notice: Subject to any disclaimer, the term of this patent is extended or adjusted under 35 U.S.C. 154(b) by 554 days.

(21) Appl. No.: 10/134,390

(22) Filed: Apr. 30, 2002

(65) Prior Publication Data

US 2003/0204793 A1    Oct. 30, 2003

(51) Int. Cl.
*G04F 10/00* (2006.01)

(52) U.S. Cl. .......................... 702/189; 702/66; 702/69; 702/71; 702/79; 702/89; 714/700

(58) Field of Classification Search ................. 702/57, 702/64–67, 69–72, 182, 189, 79, 89, 179; 704/700; 327/334, 355; 714/700
See application file for complete search history.

(56) References Cited

U.S. PATENT DOCUMENTS

| 4,584,489 | A  | * | 4/1986 | Tanaka ........................ 327/135 |
| 4,982,350 | A  | * | 1/1991 | Perna et al. ................... 702/89 |
| 5,198,785 | A  | * | 3/1993 | Jordan ......................... 332/109 |
| 6,366,038 | B1 | * | 4/2002 | Bohm ......................... 318/254 |
| 6,384,649 | B1 | * | 5/2002 | Boerstler et al. ........... 327/156 |
| 6,507,182 | B1 | * | 1/2003 | Muljono et al. .......... 324/76.79 |
| 6,600,271 | B1 | * | 7/2003 | Chen .......................... 315/224 |
| 6,687,844 | B1 | * | 2/2004 | Zhang ........................ 713/503 |
| 6,714,605 | B1 | * | 3/2004 | Sugar et al. ................. 375/340 |
| 6,768,703 | B1 | * | 7/2004 | Nygaard, Jr. et al. ......... 368/10 |
| 6,785,622 | B1 | * | 8/2004 | Nygaard, Jr. ................ 702/67 |
| 6,816,987 | B1 | * | 11/2004 | Olson et al. ................ 714/704 |
| 2002/0105292 | A1 | * | 8/2002 | Itoi ............................ 315/399 |
| 2003/0051086 | A1 | * | 3/2003 | Smith et al. ................ 710/106 |
| 2003/0231714 | A1 | * | 12/2003 | Kjeldsen et al. ............ 375/259 |

* cited by examiner

*Primary Examiner*—Marc S. Hoff
*Assistant Examiner*—Jeffrey R West
(74) *Attorney, Agent, or Firm*—LeMoine Patent Services, PLLC (57) ABSTRACT

A method and apparatus for converting skew in a received signal to a low frequency voltage. A signal is received at a destination node from an original signal from a source node. A unity time-voltage sawtooth ramp signal is created at the destination node. The amplitude of the unity time-voltage sawtooth ramp signal is a value in voltage proportional to a pulse width value of the original signal. The unity time-voltage sawtooth ramp signal starts just before the start of the received signal. A skew time is measured from the start of the unity time-voltage sawtooth ramp signal to a threshold level on an edge of the received signal. The measured skew time is correlated to a voltage level on the unity time-voltage sawtooth ramp. The measured skew time for each edge is converted into a pulse where the voltage level of each pulse being proportional to the measured skew.

22 Claims, 9 Drawing Sheets

METHOD AND APPARATUS FOR MEASURING DATA TIMING USING UNITY TIME-VOLTAGE SAWTOOTH RAMPS

BACKGROUND

1. Field

This invention relates to a method and apparatus for measuring data timing using time-voltage sawtooth ramps.

2. Background

In electronics, as data is being transmitted from a source to a destination, it is important that the destination receive the data accurately. However, depending on various factors such as the type of data, frequency of data, channel between the source and destination, etc., errors or inaccuracies may occur in the received data at the destination.

In digital communications, the "eye diagram" is used to visualize how waveforms used to send multiple bits of data across a channel can potentially lead to errors in the interpretation of those bits at the receiver. This problem of inter-symbol interference is caused by jitter that creates errors in the channel. Jitter is a measure of signal quantity and is defined as the measure of variance in signal characteristics. A zero jitter measurement indicates that the signal transition occurs at exactly the same point in time for each transition.

An eye diagram chops up a received signal into each segment of time and overlays each segment on top of one another. If there is no jitter, the eye diagram looks similar to a stop sign. In contrast, wide super imposed transitions in the eye pattern diagram represents high jitter associated with the signals, implying that the signals are not consistently transitioning at the required time. A small eye width implies a large variance in signal transition time. In designing a channel and for measuring quality of a channel, an eye diagram showing jitter may be used.

Before a channel between a source and a destination is used, it may be simulated to predict the amount of potential jitter. In simulation, successive measurements of voltage at a time are preformed to get the eye diagram mathematically. However, this is problematic in that the waveform must be reconstructed in order to be measured. Moreover, current simulation techniques require a huge amount of measurements. These measurements require the use of a lot of CPU time, simulation time, and disk space. For example, for each simulation/measurement (approximately 1000 runs), data must be analyzed and stored. Each measurement adds to the complexity and time in an exponential manner.

Therefore, a need exists for method and apparatus for detecting eye diagrams and skew on a channel with no requirement to write to disk, and for evaluating the channel in real time.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to a method and apparatus that converts threshold-crossing events of a high-speed received signal to a much lower frequency voltage. The present invention may be implemented in the form of a circuit model that is a simulation component, or implemented in an actual physical circuit. Threshold events on an edge of a signal that are converted to voltages may be proportional to time relative to the fundamental baud period of the signal. Combining this timing data for each edge may be used to determine the "eye" opening of a signal. However, methods and apparatus according to the present invention may utilize combinations of multiple instantiations on clock and data to determine worst case setup and hold time values on the fly (i.e., in real time without the need to store information). If the present invention is implemented in a physical circuit, the resulting voltages from this detection circuit may be used to dynamically adjust compensation circuits to increase performance and reliability of a signal channel.

The present invention utilizes a unity voltage sawtooth ramp. The period (i.e., pulse width) of the unity voltage sawtooth ramp may be set equal to the transmitted signal's baud rate. A characteristic of the unit sawtooth ramp is that the voltage is equal to, or proportional to, delay from the beginning of a period. Therefore, in the simple sense, one nanovolt would correspond to one nanosecond from the beginning of the period. The present invention may also use components such as threshold detection and filtering. These may be used to gate the unity sawtooth ramp. Peak detection generates a relatively low frequency voltage that is proportional to the high speed timing of the threshold events.

Figure 1:
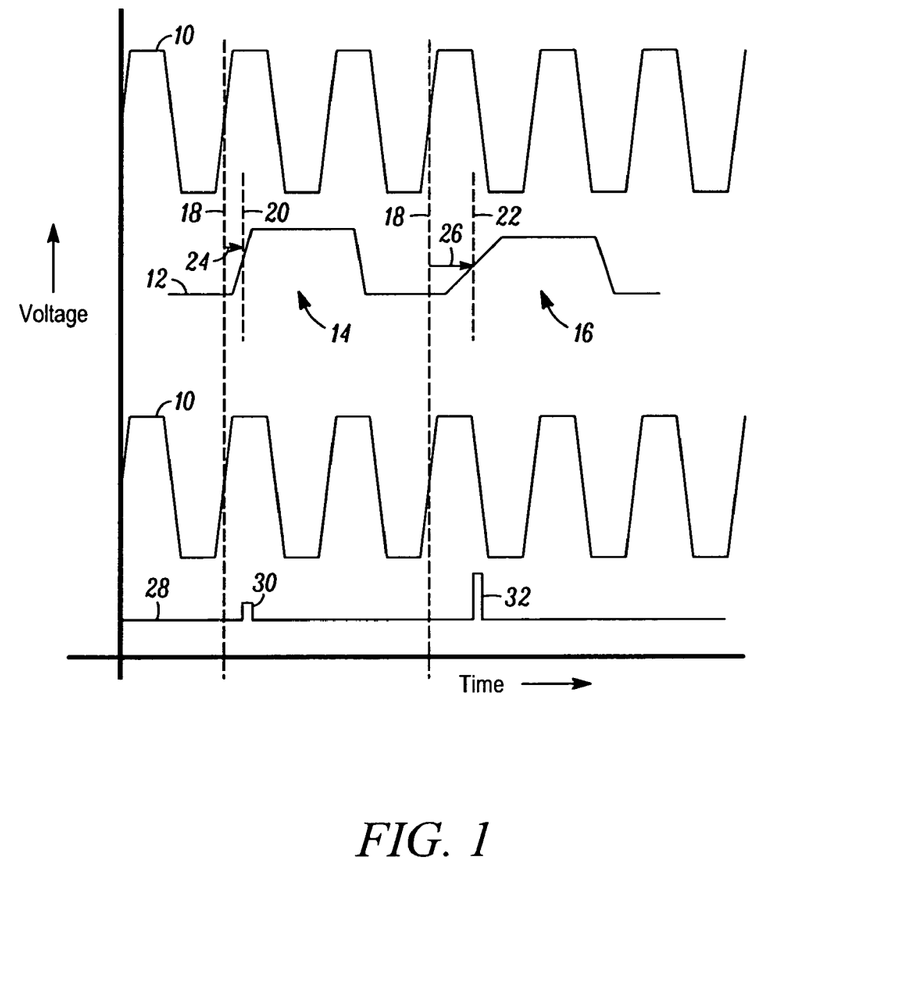
FIG. 1 is a timing diagram relating to example embodiment of the present invention.

FIG. 1 shows a timing diagram relating to an example embodiment of the present invention. Four waveforms are shown in FIG. 1 including a clock 10 (shown twice), data 12 as it appears at a receiver, and a waveform 28 showing pulses. The clock 10 may be generated locally at a receiver and synchronized to the received data 12. Waveform 12 consists of two pulses 14 and 16 representing data at the receiver. Vertical lines 18 represent a period of time on the data waveform 12 corresponding to a threshold level on the clock 10. This threshold level on the clock 10 may represent an expected start time for the data at the receiver. Vertical line 20 and 22 represent a period in time when the data 14 and 16, respectively, cross a certain threshold voltage. Arrows 24 and 26 represent measured skew of data bits 14 and 16, respectively. According to the present invention, this measured skew 24 and 26 is transformed into a voltage represented in waveform 28, as pulses 30 and 32, respectively. Pulses 30 and 32 are proportional to the measured skew 24 and 26. Therefore, as can be seen in the waveform 28, pulses with higher voltage amplitudes represent the signals with the higher skew.

Figure 2:
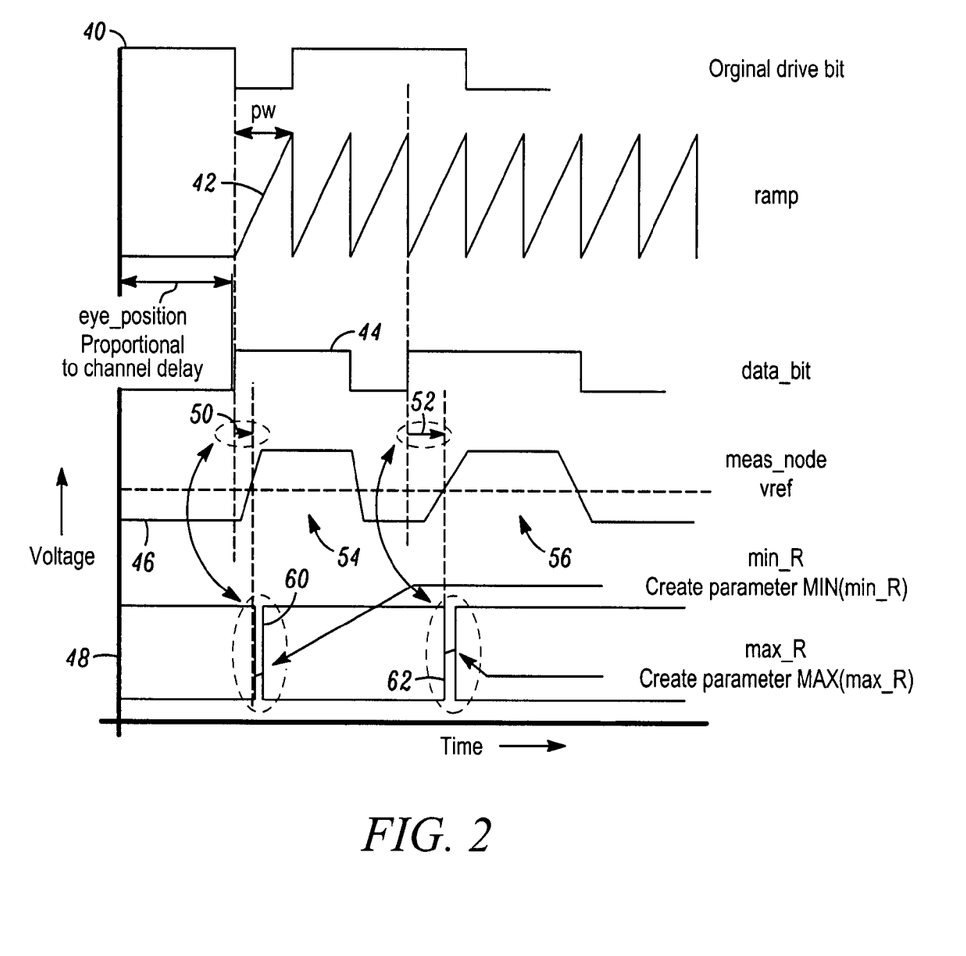
FIG. 2 is a timing diagram that includes a unity time/voltage ramp according to an example embodiment of the present invention.

FIG. 2 shows a timing diagram that includes a unity time/voltage ramp according to an example embodiment of the present invention. FIG. 2 includes a waveform 40 showing the original data at the source, a unity time/voltage ramp signal 42, a data bit 44 associated and in sync with the ramp at the receiver side, the measured data 46 at the receiver side, and a waveform 48 consisting of series of pulses 60, 62 that show the conversion of skew in time to voltage. The data bit 44 may be generated in simulation to be the original data send from a source/transmitter. In an actual physical circuit, the data bit 44 may be generated from a training sequence between the transmitter and the receiver. A training sequence may be used to determine channel characteristics before transmission of real data/information. The data bit 44 may be used in a simulation embodiment of the present invention to determine whether the original data is a positive or negative edge.

Each tooth of the sawtooth ramp 42 represents one bit of data. Sawtooth ramp 42 may start just before the edge of the received data signal 46. The ramp signal 42 is a unity/voltage ramp where the voltage of the ramp (amplitude) is proportional to the pulse width of the ramp. For example, if the amplitude of the ramp is equal to one volt, the pulse width of the ramp is equal to one second. Therefore, at any point on the ramp, voltage is equal to time. This allows the ramp to transform time into voltage.

The measured data 46 at the receiver 46 is shown with a horizontal dashed line representing a reference voltage determined by the technology used in the receiver circuit. The eye position is proportional to the channel delay that causes the ramp 42 and data bit 46 to be delayed relative to the actual start time of the transmitted data. The eye position is where the received data 46 starts. The sawtooth ramp signal 42 may be created from the original data and has a height or amplitude equal to a pulse width of the original data.

The two arrows 50 and 52 show a time from the eye position to a threshold value on data pulses 54 and 56, respectively, of received data signal 46. The arrows 50 and 52 represent the skew of these data bits with respect to the originally transmitted data bits. The two pulses 60 and 62 of waveform 48 take the skew 50 and 52 in terms of time and translate this skew into a voltage based on sawtooth ramp 42. In waveform 46, arrow 50 is shorter than arrow 52 representing a shorter skew time. Therefore, the amplitude of pulse 60, representing the skew 50 in terms of a voltage, is shorter than the amplitude of pulse 62, representing the skew 52 for data 56.

Pulses 60 and 62 both relate to skews on the rising edge of data signal pulses 54 and 56. Further, if pulses 54 and 56 were the only data received, the first pulse 60 would represent the minimum skew on the rising edge and the second pulse 62 would represent the maximum skew on the rising edge of all of the data. These values, min_R and max_R, respectively, may also be determined for skew on the falling edge of pulse 54 and the falling edge of pulse 56. In this case, the minimum skew of the falling edge may be referred to as min_F and the maximum skew on the falling edge known as max_F. Therefore, the skew on all rising edges of all data bits received and the skew on all falling edges of data bits received may be translated into pulses whose amplitudes represent the amount of skew. The smallest amplitude pulses may represent the minimum skew on the rising edges and a minimum skew on the falling edges, and the maximum amplitude pulses may represent the maximum skew on the rising edges and the maximum skew on the falling edges.

Figure 3:
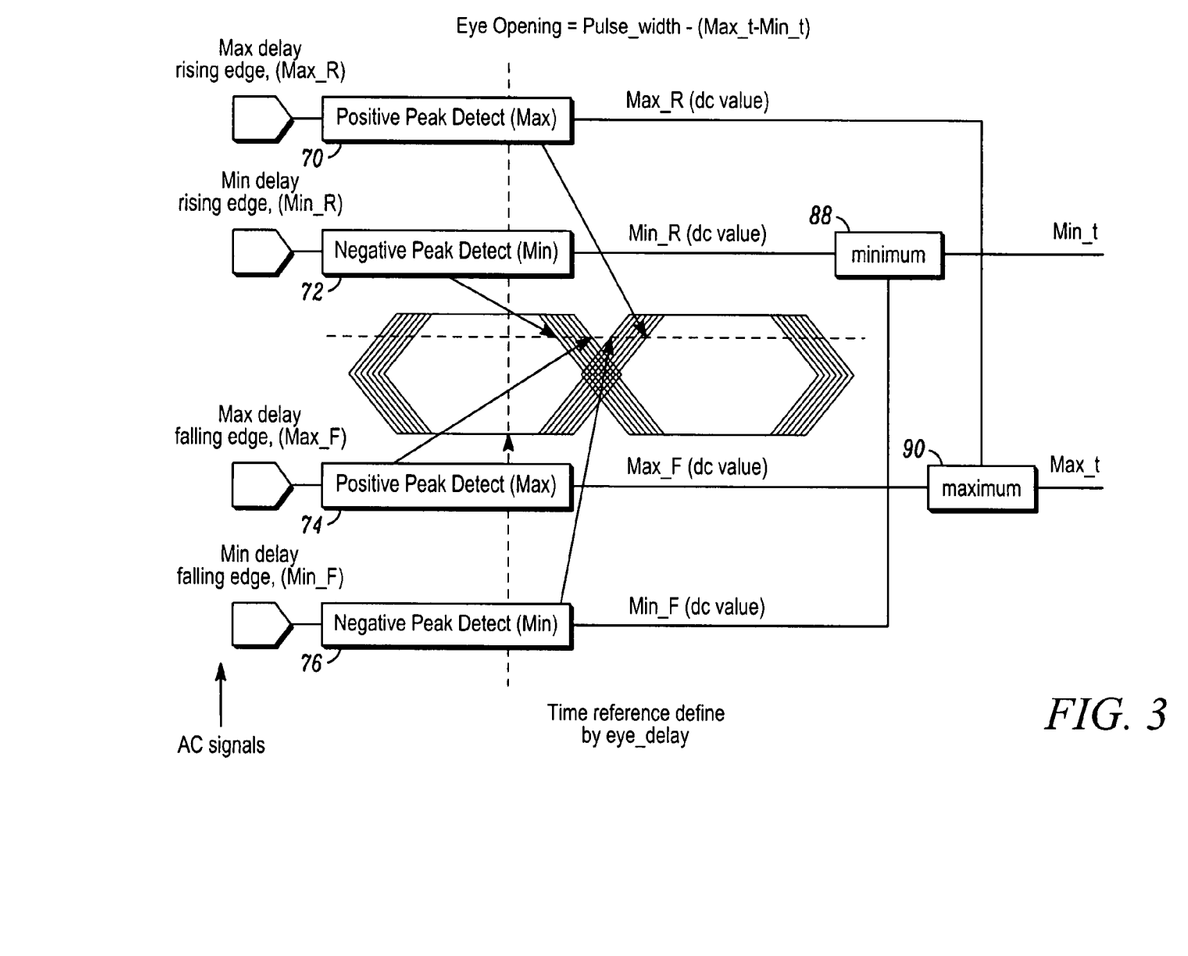
FIG. 3 is a diagram of the formulation of an eye opening according to an example embodiment of the present invention.

FIG. 3 shows a diagram of the formulation of an eye opening according to an example embodiment of the present invention. The eye opening may be determined by the pulse width of the original signal, the maximum delay on the rising edges of the received signal (max_R), the minimum delay on the rising edges of the received signal (min_R), the maximum delay on a falling edges of the received signal (max_F), and the minimum delay on all falling edges of the received signal (min_F). The received signal may be passed through a positive peak detector 70 to determine the max_R value. The received signal may also be passed to a positive peak detector 74 to determine the max_F value. These two values, max_R and max_F, may be compared by a comparator 90 to determine a maximum delay on either a rising edge or a falling edge of the received signal. The maximum delay may be referred to as max_t.

Similarly, the received signal may be passed through a negative peak detector 72 to determine the min_R value. Also, the received signal may pass through a negative peak detector 76 to determine the min_F value. The min_R signal and min_F signal may be compared by a comparator 88 to determine the minimum delay on the rising edges and falling edges, referred to as min_t. The eye-opening is equal to the pulse width of the original signal minus the difference between max_t minus min_t (i.e., eye opening=pw–(max_t–min_t)). Therefore, once these values are known, the eye-opening can be determined.

Figure 4:
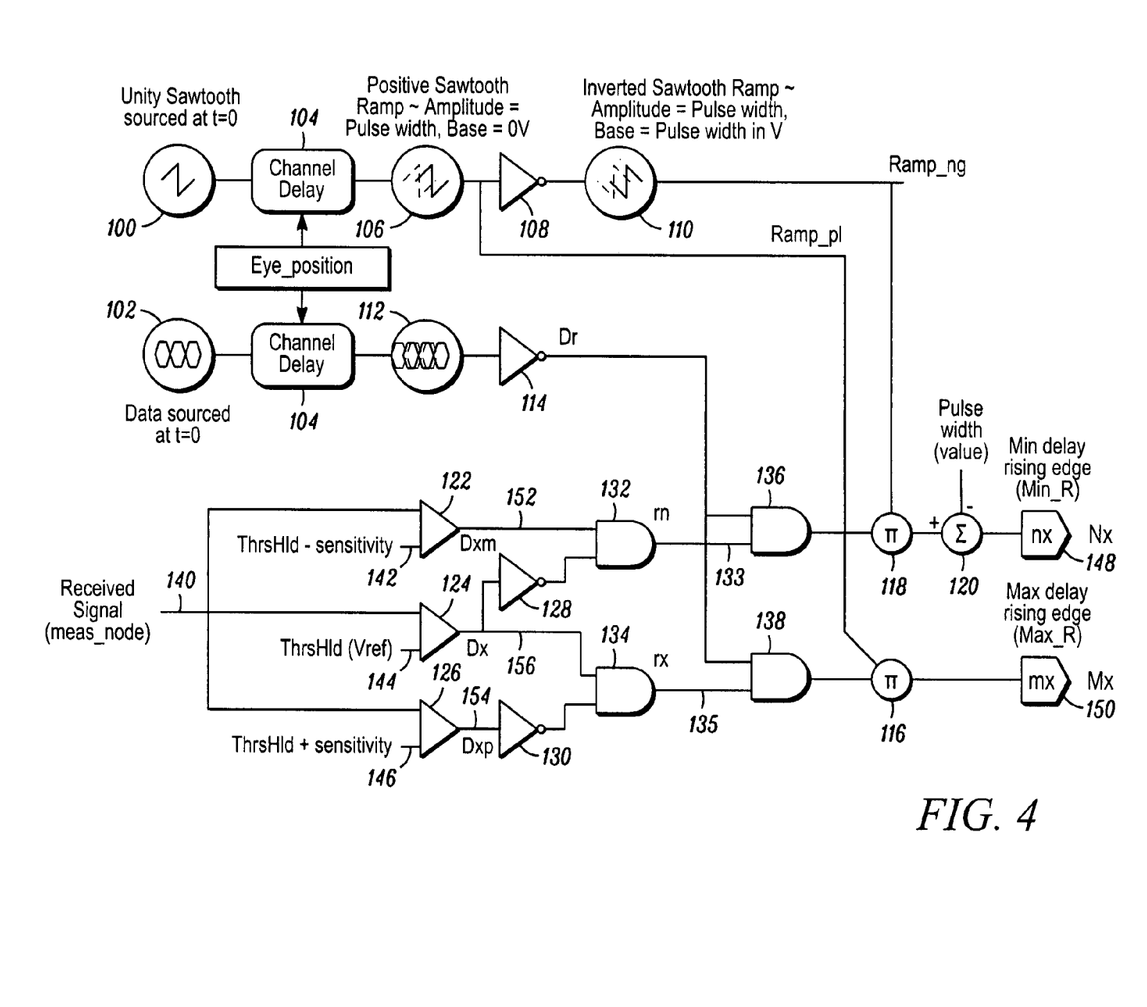
FIG. 4 is a circuit diagram for accomplishing rising edge threshold time detection according to an example embodiment of the present invention.

FIG. 4 shows a circuit diagram for rising edge threshold time detection according to an example embodiment of the present invention. Data signal 102 and unity sawtooth waveform 100 may be sourced at a time t=0. Both data signal 102 and unity sawtooth waveform 100 may be transmitted across a channel that experiences a channel delay 104. Channel delay 104 causes the unity sawtooth waveform 100 and data 102 to experience a shift in time, 106 and 112, respectively, relative to the sourced time. The diagrams of the positive sawtooth 106 and the shifted data 112 reflect what these signals may appear like at the receiver side. Both the positive sawtooth 106 and the shifted data 112 may be sent to inverters, 108 and 114, respectively. The non-inverted positive sawtooth signal 106 may be fed to a multiplier 116 where it may be multiplied with the received data signal 140 after the received data signal has passed through threshold comparison logic. The output of the multiplier 116 produces the maximum delay rising edge signal (max_R) 150. Similarly, the inverted positive sawtooth ramp signal 110 may be fed to a multiplier 118 where it may be multiplied with a version of the received signal 140 after it has passed through threshold logic. The output of gates 136, 138 of the threshold logic may be a logic signal whose value is either 0 or 1. The signal out of multiplier 118 may be fed to a summer 120 where it may be added with a pulse width value. The output of the summer 120 produces a minimum delay rising edge (min_R) signal 148.

The data signal received at the receiver (the measured node) may be fed to three comparators 122, 124, 126 where it may be compared with voltages at different threshold levels. In this example embodiment, the measured received signal 140 and a minimum sensitivity threshold voltage 142 are both fed into comparator 122 and compared producing a signal Dxm 152. Similarly, the received signal 140 may be fed to a comparator 124 and compared with a voltage reference threshold 144 producing a signal Dx 156. Further, the received signal 140 may be fed to a third comparator 126 where it may be compared with a maximum sensitivity threshold voltage 146 producing an output signal Dxp 154. Although in this example embodiment, three threshold levels are shown, the present invention is not limited to this embodiment and may be implemented with one threshold voltage level or multiple threshold voltage levels.

A logic gate 134 may receive the Dx signal 156 and an inverted Dxp signal (through invertor 130) and produces an rx signal 135 in the form of a pulse. The rx signal 135 may be fed to a logic gate 138 where it may be logically AND'ed with the invert (through inverter 114) of the shifted data 112. The output of logic gate 138 produces a signal outputted from the threshold comparison logic that is multiplied with the positive sawtooth ramp waveform 106 by multiplier 116, as noted previously.

Similarly, the shifted data signal 112 inverted may be fed to a logic gate 136 where it is AND'ed with an rn signal 133 in the form of a pulse produced from logic gate 132 that logically AND'ed Dxm signal 152 and the invert (through inverter 128) of the Dx signal 156. The output of logic gate 136 produces a signal that may be multiplied by multiplier 118 with the inverted sawtooth ramp signal 110, as noted previously.

Comparators 122, 124,126, and logic gates 128 and 130 form comparator logic. Logic gates 132 and 134 serve as pulse generators. The comparator logic, pulse generators, and logic gates 136 and 138 form the threshold comparison logic referred to previously. The present invention is not limited by the implementations of the comparator logic, pulse generators, or logic gates shown here and covers any implementations of these functions that may fall within the spirit and scope of the present invention.

A similar circuit may be used for falling edge threshold time detection. For falling edge threshold detection, the circuit looks the same as that shown in FIG. 4 for rising edge threshold detection, but with a few minor modifications. The data signal 112 is not inverted and has no inverter in its path. The inverter 128 is not on the Dx signal 156, but instead resides between comparator 122 and logic gate 132. Further, an inverter 130 is not between comparator 126 and logic gate 134 but resides between comparator 124 and logic gate 134. The output of the multiplier 116 now produces the maximum delay falling edge signal (max_F), and the output of the summer 120 now produces the minimum delay failing edge signal (min_F).

Figure 5:
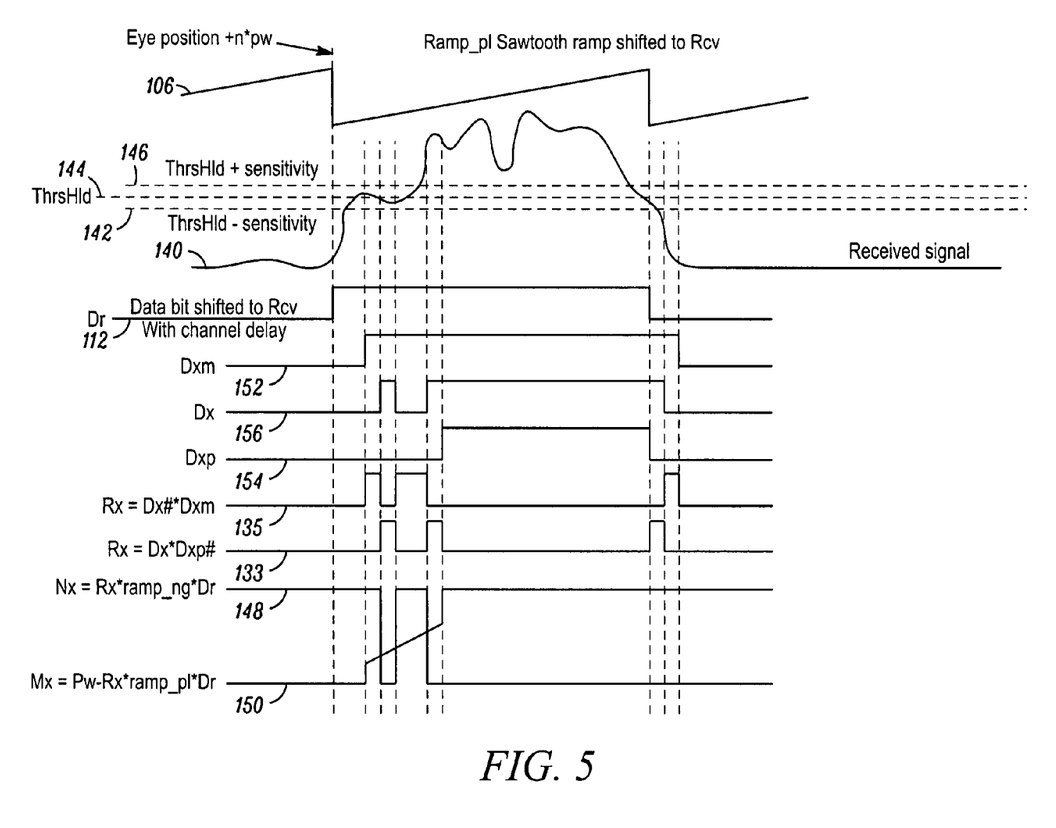
FIG. 5 is a timing diagram relating to rising edge threshold detection according to an example embodiment of the present invention.

FIG. 5 shows a timing diagram for rising edge threshold detection according to an example embodiment of the present invention. This diagram shows example timing that may exist on the various signals shown in FIG. 4. These waveforms include the positive sawtooth ramp signal 106, the maximum sensitivity threshold voltage 146, the voltage reference threshold 144, the minimum sensitivity threshold voltage 142, the received signal 140, the shifted data signal 112, the Dxm signal 152, the Dx signal 156, the Dxp signal 154, the Rx signal 135, the Rn signal 133, the Nx signal (min_R) 148, and the Mx signal (max_R) 150. The timing diagram of FIG. 5 may represent implementations of the present invention in simulator embodiments or physical circuit embodiments.

The present invention may also be implemented in a simulator or simulation environment. The following is example High-speed Software Process Improvement and Capability dEtermination (HSPICE) code for the maximum delay detection from the falling edge and the maximum delay detection from a rising edge respectively, according to an example embodiment of the present invention.

```
************************************************************
*************        Maximum delay detection from falling edge        ************
************************************************************
*
.SUBCKT MAX_FALL_FROM_EYE load_port data_bit mx nx ramp_plus
pulse_width=–1 eye_delay=–1 Vthld=–1
* force parameter passing by setting to –1
*        data        -        input data (assumed to be either 0 or 1)
*        dataa        -        delayed input data
```

-continued

```
*          mx        -        maximum delay output measurement (delay slice) 1v =
1ns
*          nx        -        minimum delay output measurement (delay slice) 1v = 1ns
*
*          pulse_width       passed pulse width of data signal
*          eye_delay          approx delay coinciding with beginning of edge
*          Vthld              Threshold voltage to measure cycle delay
.param sensitivity=0.06    * sensitivity of the threshold detector
*
Edela dataa 0 DELAY data_bit 0 TD='eye_delay'
Rdataa dataa 0 1K
* * * * * * -->>>Create positive unity ramp
*          "eye_delay" is used to adjust the delay of the ramp to coincide with the
*          beginning of the received rising edge
Vramp_plus ramp_plus 0 PULSE 0 '(pulse_width-10p)*1e9'
+ 'eye_delay' 'pulse_width-10p' 10p 0 'pulse_width'
* * * * * * -->>>Create negative unity ramp
*          "eye_delay" is used to adjust the delay of the ramp to coincide with the
*          beginning of the received rising edge
Vramp_minus ramp_minus 0 PULSE '(pulse_width-10p)*1e9' 0
+ 'eye_delay' 'pulse_width-10p' 10p 0 'pulse_width'
* * * * * * -->>>Create received data
Edetector rcv_data 0 VCVS PWL(1) load_port 0
+0,0
+'Vthld-1p', 0
+Vthld, 1
+'Vthld+1p',1
+1,1
* * * * * * -->>>Creata received data trigger slightly before vthld
Edetectorm rcv_data_m 0 VCVS PWL(1) load_port 0
+0,0
+'Vthld-1p-sensitivity', 0
+'Vthld-sensitivity', 1
+'Vthld+1p-sensitivity', 1
+1,1
* * * * * * -->>>Creata received data trigger slightly before vthld
Edetectorn rcv_data_p 0 VCVS PWL(1) load_port 0
+0,0
+'Vthld-1p+sensitivity', 0
+'Vthld+sensitivity', 1
+'Vthld+1p+sensitivity', 1
+1,1
* rmp is the time ramp in ns
* mx is the slice of the time ramp in ns/v for the maximum delay
* nx is the slice of the time ramp in ns/v for the minimum delay
Erx rn 0 vol='(1-V(Rcv_data))*(V(Rcv_data_m))'
Ern rx 0 vol='(V(Rcv_data))*(1-V(Rcv_data_p))'
Emx mx 0 vol='V(rx)*V(ramp_plus)*(1-v(dataa))'
Emn nx 0 vol='1e9*(pulse_width-10p)-(V(rn)*V(ramp_minus)*(1-v(dataa)))'
.ENDS
                ************************************************************
*************        Maximum delay detection from Rising edge        *************
                ************************************************************
*
.SUBCKT MAX_RISE_FROM_EYE load_port data_bit mx nx ramp_plus
pulse_width=-1 eye_delay=-1 Vthld=-1
* force parameter passing by setting to -1
*          data      -        input data (assumed to be either 0 or 1)
*          dataa     -        delayed input data
*          mx        -        maximum delay output measurement (delay slice) 1v =
1ns, 0 volts   =base
*          nx        -        minimum delay output measurement (delay slice) 1v = 1ns,
PW*1e9 volts=base
*
*          pulse_width       passed pulse width of data signal
*          eye_delay          approx delay coinciding with beginning of edge
*          Vthld              Threshold voltage to measure cycle delay
.param sensitivity=0.06    * sensitivity of the threshold detector
*
Edela dataa 0 DELAY data_bit 0 TD='eye_delay'
Rdataa dataa 0 1K
* * * * * * -->>>Create positive unity ramp
*          "eye_delay" is used to adjust the delay of the ramp to coincide with the
*          beginning of the received rising edge
Vramp_plus ramp_plus 0 PULSE 0 '(pulse_width-10p)*1e9'
+'eye_delay' 'pulse width-10p' 10p 0 'pulse_width'
* * * * * * -->>>Create negative unity ramp
*          "eye_delay" is used to adjust the delay of the ramp to coincide with the
*          beginning of the received rising edge
```

```
-continued

Vramp_minus ramp_minus 0 PULSE '(pulse_width-10p)*1e9' 0
+ 'eye_delay' 'pulse_width-10p' 10p 0 'pulse_width'
* * * * * -->>>Creata received data
Edetector rcv_data 0 VCVS PWL(1) load_port 0
+0,0
+'Vthld-1p', 0
+Vthld, 1
+'Vthld+1p',1
+1,1
* * * * * -->>>Creata received data trigger slightly before vthld
Edetectorm rcv_data_m 0 VCVS PWL(1) load_port 0
+0,0
+'Vthld-1p+sensitivity', 0
+'Vthld+sensitivity', 1
+'Vthld+1p+sensitivity', 1
+1,1
* * * * * -->>>Creata received data trigger slightly before vthld
Edetectorn rcv_data_p 0 VCVS PWL(1) load_port 0
+0,0
+'Vthld-1p-sensitivity', 0
+'Vthld-sensitivity', 1
+'Vthld+1p-sensitivity', 1
+1,1
* mx is the slice of the time ramp in ns/v for the maximum delay (0 V base)
* nx is the slice of the time ramp in ns/v for the minimum delay
Erx rx 0 vol='(V(Rcv_data))*(1-V(Rcv_data_m))'
Ern rn 0 vol='(1-V(Rcv_data))*(V(Rcv_data_p))'
Emx mx 0 vol='V(rn)*V(ramp_plus)*(v(dataa))'
Emn nx 0 vol='1e9*(pulse_width-10p)-(V(rx)*V(ramp_minus)*(v(dataa)))'
.ends
```

In a simulation environment, the original data bit may be needed to distinguish between a positive and negative edge. In an actual circuit, the original data bit may not be needed. Moreover, in an actual physical circuit, the sawtooth ramp may be based on an extracted clock. This extracted clock may be determined during a training sequence between the transmitter and receiver. In a simulation environment, the sawtooth signal may be created from the original data.

Moreover, in an actual circuit embodiment of the present invention, the sawtooth ramp preferably is one half the pulse width of the transmitted data, therefore, allowing the obtaining of all the rising and falling edges. The original data bit in a simulation embodiment of the present invention may be created. In an actual circuit, there may be a training mode where predetermined sequence data is transferred between the source and the destination as part of a training sequence. From this training sequence, the data bit may be generated at the receiver. Training mode is used for settling out capacitive effects. Generally, it may be used at startup to synchronize all phase locked loops. A clock may be extracted from the data at the receiver side and agreed upon between the receiver and sender such that the timing can be synchronized. The clock may be a synchronization of the ramp to the data positioned slightly before and after each data edge. The training sequence is generally based on the types of real data that will be transferred.

Figure 6A:
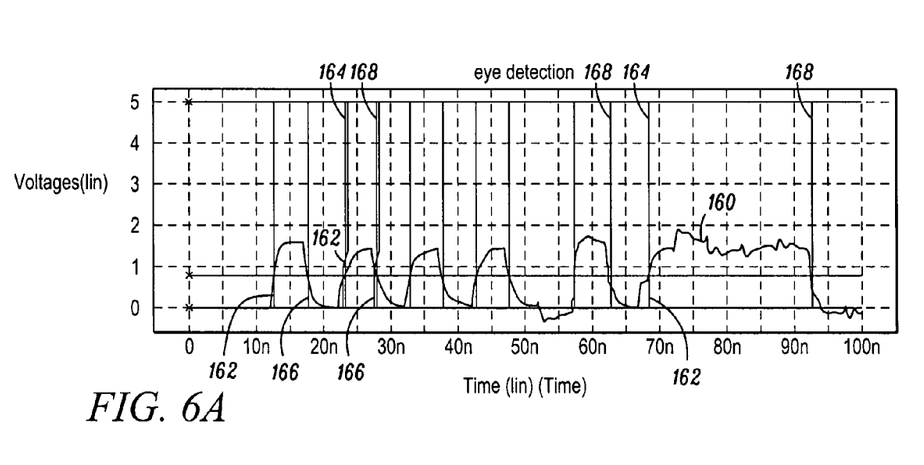
FIGS. 6A and 6B are diagrams showing timing from a simulation according to an example embodiment of the present invention.
Figure 6B:
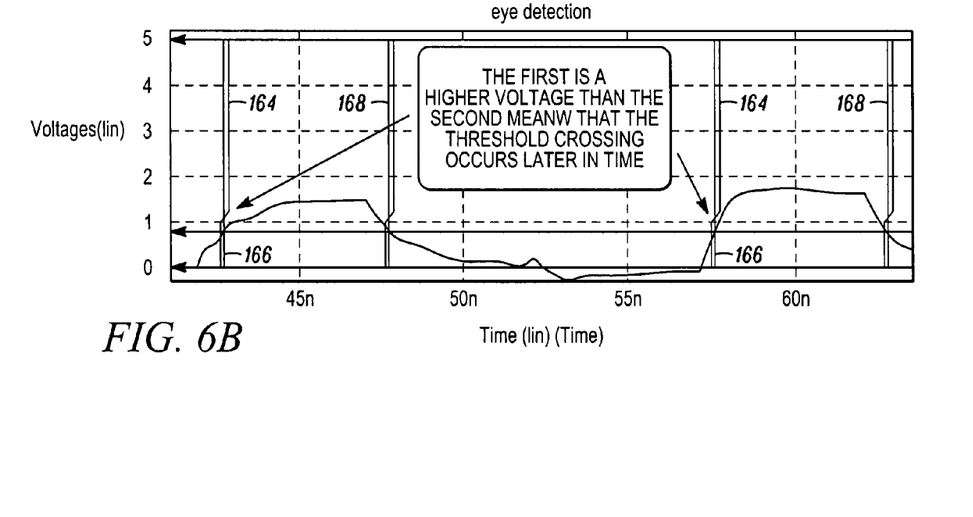

FIGS. 6A and 6B show diagrams showing timing from a simulation according to an example embodiment of the present invention. FIGS. 6A and 6B show the received waveform 160, as well as the generated pulses for each associated rising and falling edge of each pulse of the waveform. These include, the maximum rising edges 162, the minimum rising edges 164, maximum failing edges 166, and minimum falling edges 168. According to the present invention, for a received waveform, to identify the cycle with the biggest problem, one need only look at the generated pulses for the received waveform and identify the pulses that have the highest amplitudes. In this example embodiment, this is the pulse at approximately 69 ns (nanoseconds). FIG. 6B shows an enlarged view of a portion of FIG. 6A, from approximately 41 ns through 63 ns. These pulses associated with the maximum rising edge, the minimum rising edge, the maximum falling edge, and the minimum falling edge, may be used to determine the eye opening for a given cycle.

Figure 7:
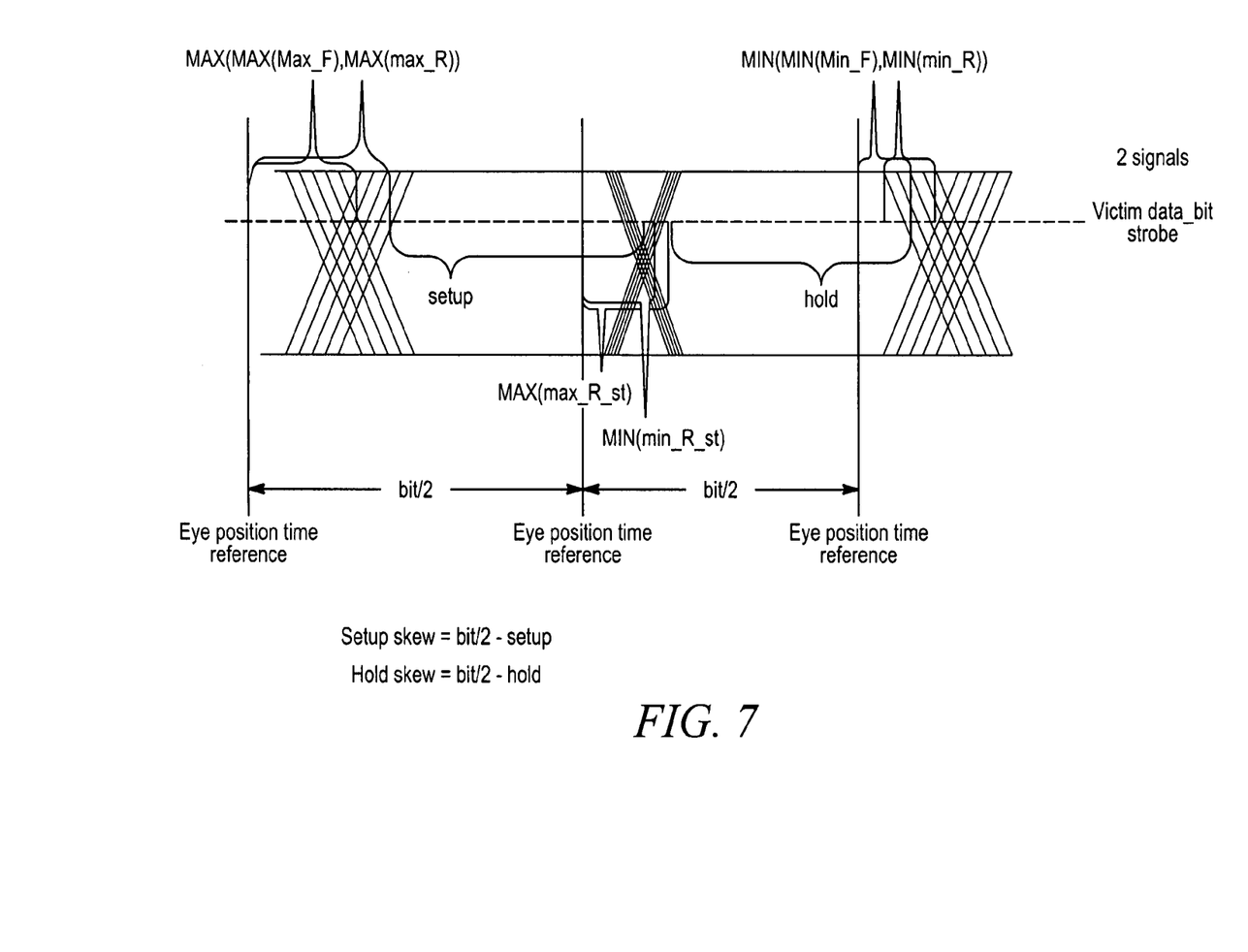
FIG. 7 is a diagram of an eye opening used to determine setup time and hold time skew according to an example embodiment of the present invention.

FIG. 7 shows a diagram of an eye opening used to determine setup time and hold time skew according to an example embodiment of the present invention. The setup time may be determined from the maximum of the maximum fall and maximum rise times (i.e., max (max(max_F), max(max_R))). The hold time may be determined from the minimum of the minimum fall times and the minimum rise times (i.e., min (min(min_F), (min_R))). For determining setup and hold, preferably the sawtooth ramp is set to be equal to one half of the bit pulse width. The setup skew is equal to one half the bit width minus the setup time. The hold skew is equal to one half the bit width minus the hold time.

Figure 8:
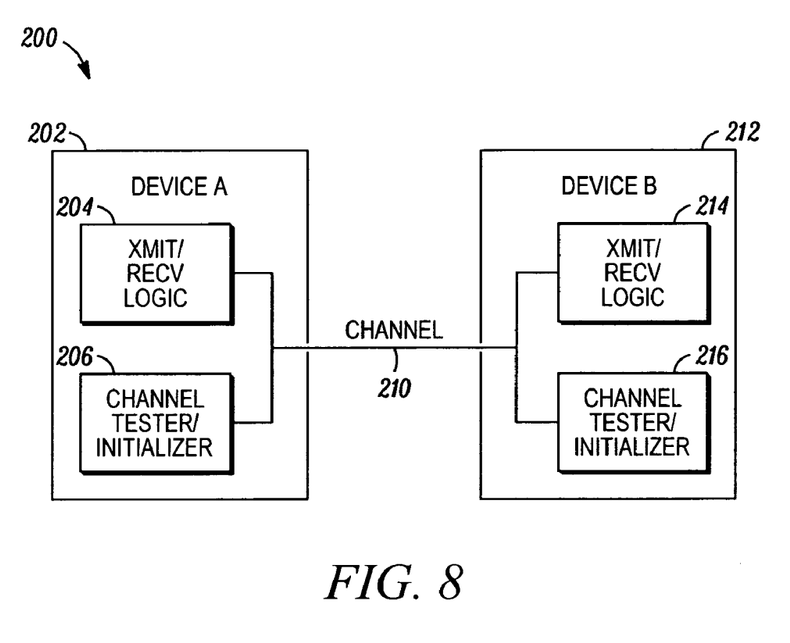
FIG. 8 shows a diagram of a system for measuring data timing using time-voltage sawtooth ramps according to an example embodiment of the present invention.

FIG. 8 shows a diagram of a system for measuring data timing using time-voltage sawtooth ramps according to an example embodiment of the present invention. A system 200 may include a first device A 202 operatively connected to a second device B 212 via a channel 210. The channel 210 allows the transfer of control and data information between the device A 202 and device B 212. Device A may include transmit/receive logic 204 and channel tester/initializing logic 206. Similarly, device B may include transmit/receive logic 214 and channel tester/initializing logic 216.

The channel tester/initializing logic 206, 216 may test and analyze the characteristics of the channel 210 before device A 202 and device B 212 begin transferring real data between each other. The channel tester/initializing logic 206, 216 may transfer test data across channel 210 to analyze the skew on the data transferred. The channel tester/initializing logic 206, 216 may, as has been discussed previously, use a unity-time voltage sawtooth ramp signal whose amplitude is a value in voltage proportional to a pulse width value of the transferred data, to convert the measured skew time for each edge into a pulse where the voltage level of each pulse is proportional to the measured skew.

The resultant pulses may be used by the transmit/receive logic 204, 214 (or other logic in device A 202 or device B 212) to adjust parameters and/or controls to compensate for the characteristics of the channel 210 and improve the performance of sending information across the channel 210.

Figure 9:
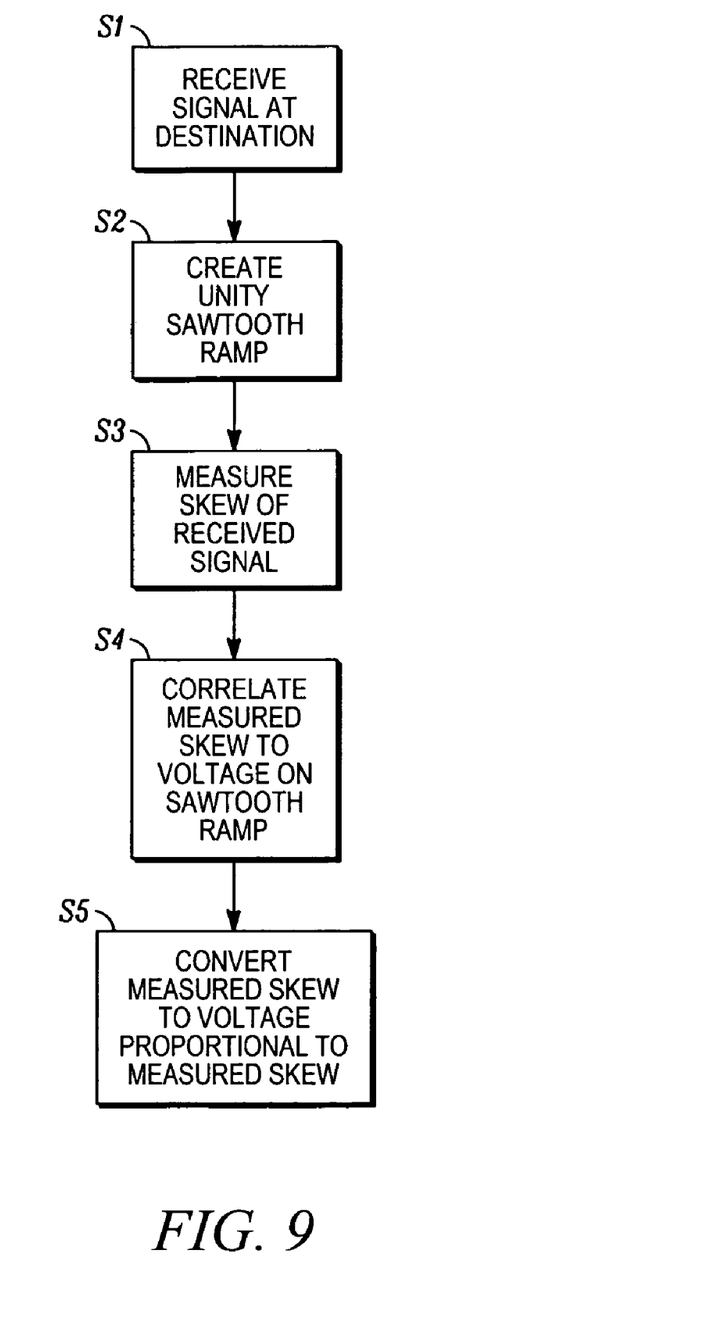
FIG. 9 shows a flowchart of a process for measuring data timing using time-voltage sawtooth ramps according to an example embodiment of the present invention.

FIG. 9 shows a flowchart of a process for measuring data timing using time-voltage sawtooth ramps according to an example embodiment of the present invention. A signal may be received at a destination node from an original signal from a source node S1. A unity time-voltage sawtooth ramp signal may be created at the destination node S2. The amplitude of the unity time-voltage sawtooth ramp signal is a value in voltage proportional to a pulse width value of the original signal. The unity time-voltage sawtooth ramp signal may start just before the start of the received signal. A skew time may be measured from the start of the unity time-voltage sawtooth ramp signal to a threshold level on an edge of the received signal S3. The measured skew time may be correlated to a voltage level on the unity time-voltage sawtooth ramp S4. The measured skew time for each edge may then be converted into a pulse where the voltage level of each pulse being proportional to the measured skew S5.

Methods and apparatus according to present invention are advantageous for use in an actual circuit or in a simulation environment in that direct output of timing data is produced that eliminates the need for hardware to support post processing scripts and spread sheets. Moreover, the present invention provides quick identification of worst-case cycles. The present invention saves the use of a lot of CPU time, simulation time, and disk space. In addition, the outputs from present invention may be used to adjust controls to improve the performance of sending data over a channel.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A method comprising:
    receiving a signal at a destination node, the received signal being from an original signal transmitted from a source node;
    creating a positive unity time-voltage sawtooth ramp signal at the destination node, the amplitude of the positive unity time-voltage sawtooth ramp signal being a value in voltage proportional to a pulse width value of the original signal, the positive unity time-voltage sawtooth ramp signal starting just before a start of the received signal;
    inverting the positive unity time-voltage sawtooth ramp signal to generate a negative unity time-voltage sawtooth ramp signal;
    measuring a first skew time from the start of the positive unity time-voltage sawtooth ramp signal to a first threshold level on an edge of the received signal;
    measuring a second skew time from the start of the negative unity time-voltage sawtooth ramp signal to a second threshold level on the edge of the received signal;
    correlating the first skew time to a voltage level on the positive unity time-voltage sawtooth ramp;
    correlating the second skew time to a voltage level on the negative unity time-voltage sawtooth ramp; and
    converting the first and second skew times for each edge into pulses, a voltage level of each pulse being proportional to a corresponding one of the first and second skew times.

2. The method according to claim 1, further comprising identifying a worst case cycle of the received signal based on the pulses, the worst case cycle related to a cycle of the received signal with a maximum skew time.

3. The method according to claim 2, further comprising identifying the worst case cycle of the received signal by analyzing a peak voltage level of each pulse.

4. The method according to claim 3, further comprising identifying the worst case cycle of the received signal by analyzing the peak voltage level of each pulse using a peak detector.

5. The method according to claim 1, further comprising identifying a best case cycle of the received signal based on the pulses, the best case cycle related to a cycle of the received signal with a minimum skew time.

6. The method according to claim 5, further comprising identifying the best case cycle of the received signal by analyzing a peak voltage level of each pulse.

7. The method according to claim 6, further comprising identifying the best case cycle of the received signal by analyzing the peak voltage level of each pulse using a peak detector.

8. The method according to claim 1, further comprising determining a minimum skew time and a maximum skew time based on the voltage level of each pulse and creating an eye diagram of the received signal based on the minimum skew time and the maximum skew time.

9. The method according to claim 8, further comprising receiving the received signal from the original signal transmitted from the source node across a channel, the eye diagram usable to increase the performance and reliability of the channel.

10. The method according to claim 1, further comprising creating the unity time-voltage sawtooth ramp signal at the destination node where the amplitude of the unity time-voltage sawtooth ramp signal is a value in voltage twice that of the pulse width value of the original signal.

11. The method according to claim 1, further comprising creating the unity time-voltage sawtooth ramp signal at the destination node where the amplitude of the unity time-voltage sawtooth ramp signal is a value in voltage equal to the pulse width value of the original signal.

12. The method according to claim 1, further comprising determining minimum skew times and maximum skew times for each pulse based on the voltage level of each pulse and determining a setup time and a hold time for the received signal based on the minimum skew times and the maximum skew times.

13. The method according to claim 1, further comprising performing the receiving creating, measuring, correlating, and converting steps in a simulator.

14. The method according to claim 1, further comprising performing the receiving, creating, measuring, correlating, and converting steps using a physical circuit.

15. An apparatus comprising a storage medium with instructions stored therein, the instructions when executed causing a computing device to perform:
receiving a signal, the received signal being from an original signal transmitted from a source node;
creating a positive unity time-voltage sawtooth ramp signal, the amplitude of the positive unity time-voltage sawtooth ramp signal being a value in voltage proportional to a pulse width value of the original signal, the positive unity time-voltage sawtooth ramp signal starting just before a start of the received signal;
inverting the positive unity time-voltage sawtooth ramp signal to generate a negative unity time-voltage sawtooth ramp signal;
measuring a first skew time from the start of the positive unity time-voltage sawtooth ramp signal to a first threshold level on an edge of the received signal;
measuring a second skew time from the start of the negative unity time-voltage sawtooth ramp signal to a second threshold level on the edge of the received signal;
correlating the first skew time to a voltage level on the positive unity time-voltage sawtooth ramp signal;
correlating the second skew time to a voltage level on the negative unity time-voltage sawtooth ramp signal; and
converting the first and second skew times for each edge into pulses, a voltage level of each pulse being proportional to a corresponding one of the first and second skew times.

16. The apparatus according to claim 15, further comprising determining a minimum skew time and a maximum skew time based on the voltage level of each pulse and creating an eye diagram of the received signal based on the minimum skew time and the maximum skew time.

17. The apparatus according to claim 15, further comprising creating the unity time-voltage sawtooth ramp signal where the amplitude of the unity time-voltage sawtooth ramp signal is a value in voltage twice that of the pulse width value of the original signal.

18. The apparatus according to claim 15, further comprising creating the unity time-voltage sawtooth ramp signal where the amplitude of the unity time-voltage sawtooth ramp signal is a value in voltage equal to the pulse width value of the original signal.

19. The apparatus according to claim 15, further comprising determining minimum skew times and maximum skew times for each pulse based on the voltage level of each pulse and determining a setup time and a hold time for the received signal based on the minimum skew times and the maximum skew times.

20. A system for measuring data timing comprising:
a first device;
a second device;
a channel, the first device and the second device operatively connected across the channel,
wherein at least one of the first device and the second device includes circuitry to create a positive unity time-voltage sawtooth ramp signal having an amplitude in voltage proportional to a pulse width value of data transferred across the channel, circuitry to measure a first skew time from the start of the positive unity time-voltage sawtooth ramp signal to a first threshold level on an edge of the transferred data, circuitry to correlate the first skew time to a voltage level on the positive unity time-voltage sawtooth ramp signal, and circuitry to convert the first skew time into a first pulse where a voltage level of the first pulse is proportional to the first skew time, and further includes circuitry to create a negative unity time-voltage sawtooth ramp signal having an amplitude in voltage proportional to the pulse width value of data transferred across the channel, circuitry to measure a second skew time from the start of the negative unity time-voltage sawtooth ramp signal to a second threshold level on the edge of the transferred data, circuitry to correlate the second skew time to a voltage level on the negative unity time-voltage sawtooth ramp signal, and circuitry to convert the second skew time into a second pulse where a voltage level of the second pulse is proportional to the second skew time.

21. The system according to claim 20, wherein at least one of the first device and the second device includes a channel tester logic, the channel tester logic to create and use the positive and negative unity time-voltage sawtooth ramp signals to convert the first and second skew times of the transferred data into the first and second pulses.

22. The system according to claim 20, wherein at least one of the first device and the second device includes transmit/receive control logic, the first and second pulses being used by the transmit/receive control logic to make adjustments to compensate for characteristics of the channel and improve the performance of sending information across the channel.

* * * * *